United States Patent
Schaef

(10) Patent No.: US 10,910,946 B2
(45) Date of Patent: Feb. 2, 2021

(54) SELF-TUNING ZERO CURRENT DETECTION CIRCUIT

(71) Applicant: Intel Corporation, Santa Clara, CA (US)

(72) Inventor: Christopher Schaef, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/144,961

(22) Filed: Sep. 27, 2018

(65) Prior Publication Data

US 2019/0044442 A1 Feb. 7, 2019

(51) Int. Cl.
*H02M 3/158* (2006.01)
*H01L 49/02* (2006.01)
*H02M 1/00* (2006.01)

(52) U.S. Cl.
CPC ............ *H02M 3/158* (2013.01); *H01L 28/10* (2013.01); *H02M 3/1588* (2013.01); *H02M 2001/0058* (2013.01)

(58) Field of Classification Search
CPC ............... H02M 3/158; H02M 3/1588; H02M 2001/0058; H02M 3/156; H02M 2001/0003; H02M 2001/0054; H02L 28/10; Y02B 70/10
See application file for complete search history.

(56) References Cited

U.S. PATENT DOCUMENTS

| | | | | |
|---|---|---|---|---|
| 8,502,569 B2* | 8/2013 | Papaefthymiou | ...... | H03K 3/012 327/108 |
| 9,531,249 B2 | 12/2016 | Yoon et al. | | |
| 9,548,661 B2 | 1/2017 | Ryotaro et al. | | |
| 10,395,594 B1* | 8/2019 | Charisoulis | .......... | G09G 3/2074 |
| 2007/0262761 A1* | 11/2007 | Ishigaki | ............... | H02M 3/156 323/282 |
| 2008/0290854 A1* | 11/2008 | Uchiike | .............. | H02M 3/1588 323/284 |
| 2010/0201555 A1* | 8/2010 | Karavidas | ............. | H03M 1/403 341/143 |

(Continued)

FOREIGN PATENT DOCUMENTS

| KR | 20150089603 | 8/2015 |
|---|---|---|
| KR | 20150120187 | 10/2015 |
| KR | 101677674 | 11/2016 |

OTHER PUBLICATIONS

International Search Report and Written Opinion from PCT/US2019/039341 notified Oct. 18, 2019, 13 pgs.

*Primary Examiner* — Thienvu V Tran
*Assistant Examiner* — Shahzeb K Ahmad
(74) *Attorney, Agent, or Firm* — Green, Howard & Mughal LLP

(57) ABSTRACT

An apparatus has a comparator circuitry (e.g., auto-zero comparator) with a first input, a second input, a third input; and an output; a first device (e.g., a low-side switch) coupled to the first and second inputs of the comparator; and a circuitry (e.g., a self-tuning logic) to generate a digital code which represents a comparator offset adjustment with reference to detection of current through a second device (e.g., an inductor), wherein the digital code (e.g., a multibit digital signal) is provided to the third input of the comparator circuitry.

20 Claims, 15 Drawing Sheets

(56) References Cited

U.S. PATENT DOCUMENTS

| | | | |
|---|---|---|---|
| 2010/0231187 A1* | 9/2010 | Wicht | H02M 3/156 |
| | | | 323/282 |
| 2011/0012765 A1* | 1/2011 | Hsieh | H03K 3/356139 |
| | | | 341/143 |
| 2012/0019225 A1 | 1/2012 | Tsai | |
| 2012/0049822 A1* | 3/2012 | Li | H02M 3/156 |
| | | | 323/282 |
| 2013/0215656 A1* | 8/2013 | Wang | H02M 7/06 |
| | | | 363/126 |
| 2015/0069995 A1* | 3/2015 | Schrom | G01R 19/0092 |
| | | | 324/76.11 |
| 2015/0091536 A1 | 4/2015 | Tanaka | |
| 2019/0131988 A1* | 5/2019 | Li | H03K 5/22 |

\* cited by examiner

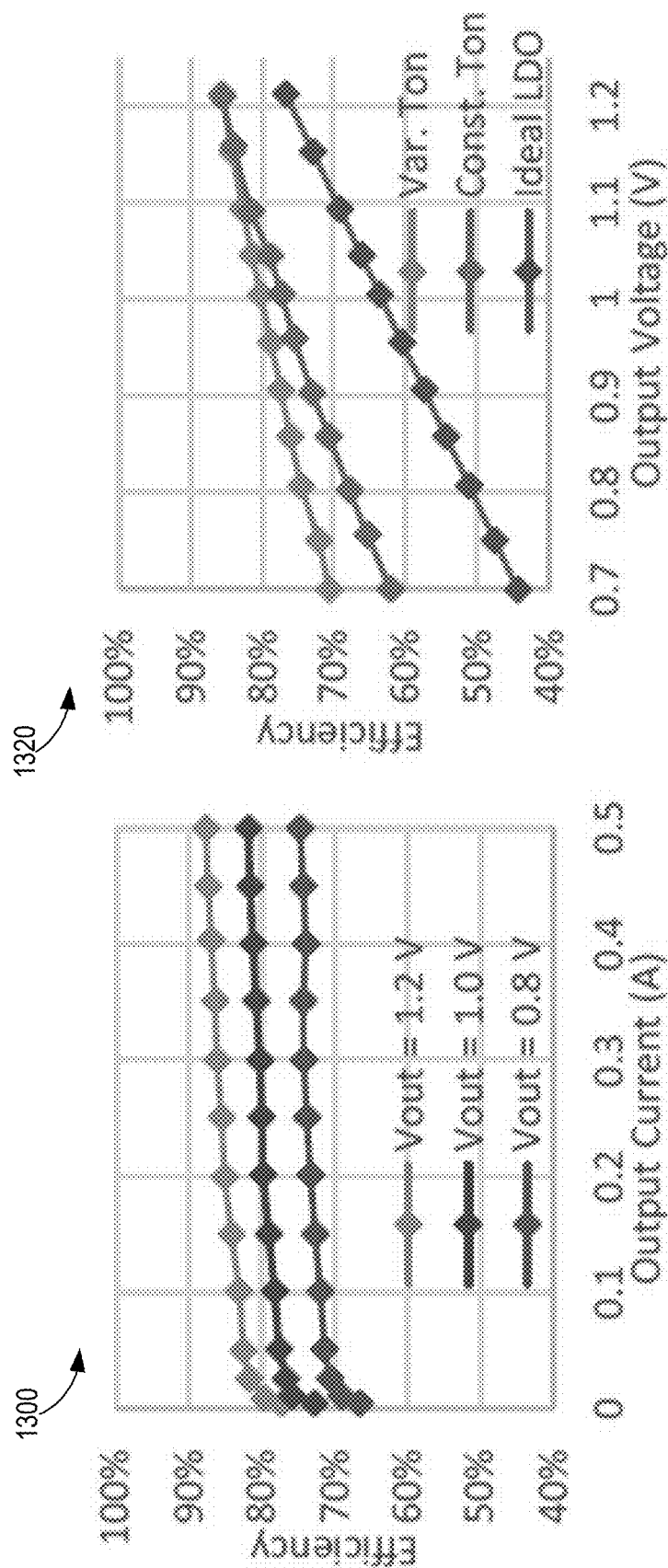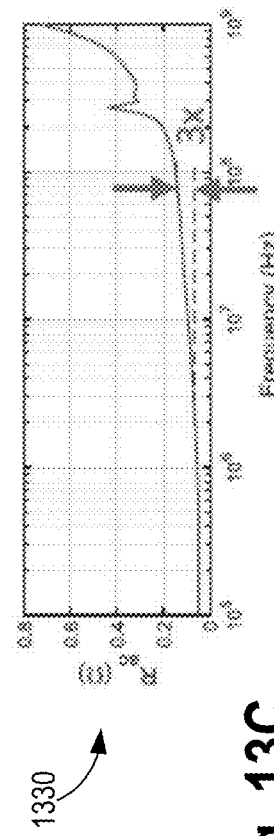
Fig. 13B
Fig. 13A
Fig. 13C

SELF-TUNING ZERO CURRENT DETECTION CIRCUIT

BACKGROUND

Fully Integrated Voltage Regulators (FIVR) with package-embedded air-core inductors or on-die solenoid inductors with planar magnetic core promise efficient power delivery and fine-grain wide-range dynamic voltage and frequency scaling (DVFS) in complex system-on-chips (SoCs) while providing fast transient response. The FIVR is expected to provide high conversion efficiency across a wide operating range of output voltages and load currents, including light to medium loads, to maximize the overall energy efficiency of the SoC across different power states. Phase shedding and switch scaling have been used for high-frequency FIVR designs with pulse-width modulation (PWM) control in continuous conduction mode (CCM) to maintain high efficiency for large load currents, and pulse frequency modulation (PFM) and hysteretic control have been used to achieve high efficiency across light to medium loads.

However, for high speed DC-DC converters that operate in discontinuous conduction mode (DCM), fast zero-current detection (ZCD) is desired to operate efficiently. Non-idealities, in ZCD related analog circuits, such as delay and offset in a comparator can have a significant impact on the overall system efficiency. In modern digital complementary metal oxide semiconductor (CMOS) processes, it is increasingly difficult to design such high performance analog circuits which results in large power and area overhead as well as expensive trimming.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIGS. 10A-B illustrate plots showing measurement data of the output voltage ripple in light-load PFM operation, where plot of FIG. 10A shows double triggering due to power delivery network (PDN) resonance effects, while FIG. 10B shows that programmable off-time is effective in preventing retriggering, in accordance with some embodiments.

FIGS. 13A-D illustrate plots showing measured efficiency data vs. load current for different output voltage, efficiency vs. output voltage for constant and variable (auto adjusted) on time, and inductor power loss spectrum, respectively.

DETAILED DESCRIPTION

Figure 1:
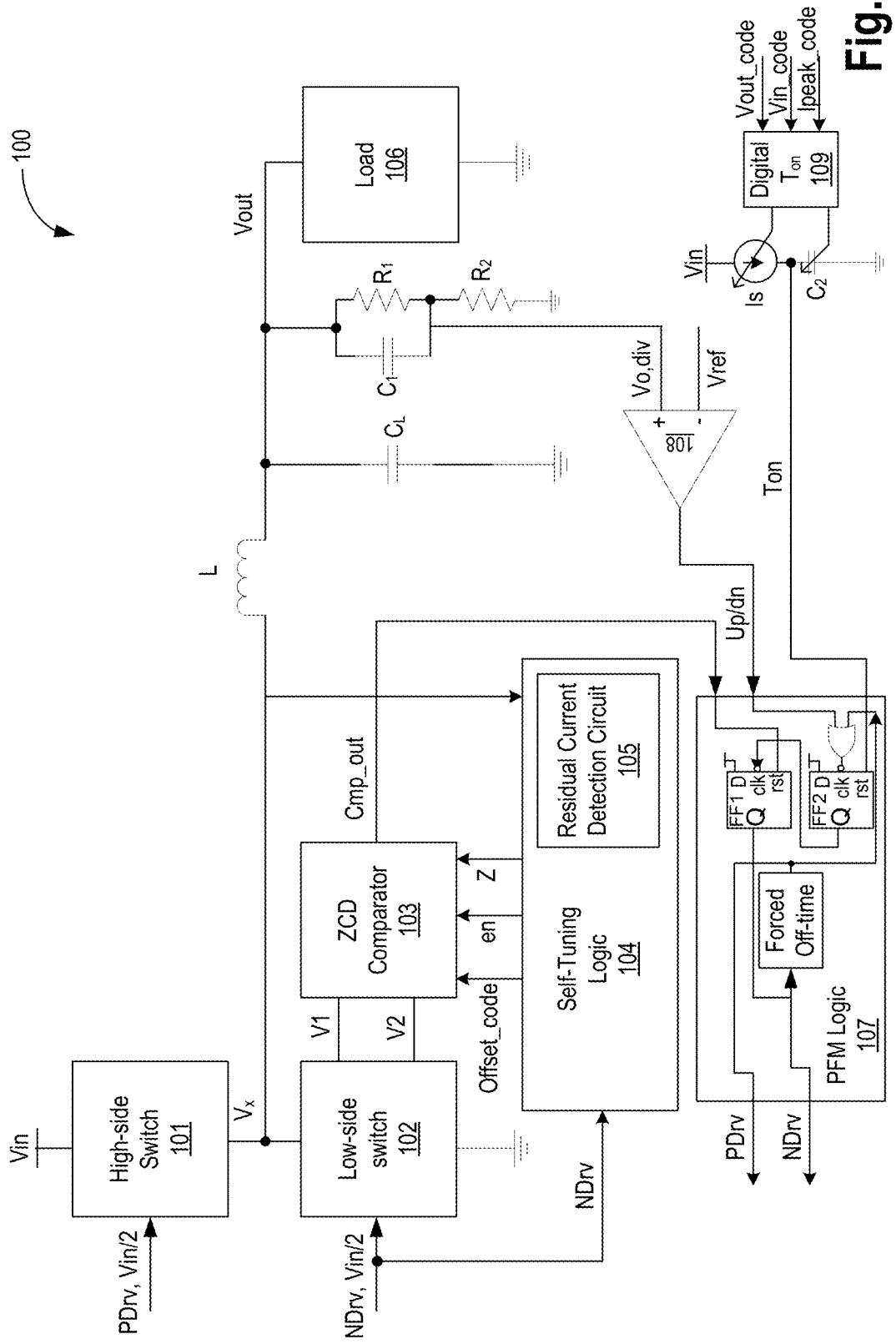
FIG. 1 illustrates an apparatus of a DC-DC converter with zero-current detection (ZCD) and associated self-tuning logic to mitigate non-idealities related to (ZCD), according to some embodiments of the disclosure.

One of the challenges for efficient DCM operation at high switching frequencies is fast and accurate detection of the zero-crossing of the inductor current. A comparator of a DC-DC converter across the low-side n-type switch is commonly used for DCM. However, low-power comparators, especially in scaled process nodes exhibit large random offsets compared to the tens of milli-volt voltage drop across the low-side n-type switch. This can degrade efficiency and create electromagnetic interference (EMI) or radio frequency interference (RFI) issues as well. Compensating for the comparator and gate driver delays pose major challenges for accurate and efficient zero current detection (ZCD). Further, when DC-DC converters are to operate at high switching frequencies (e.g., 100 MHz or greater), designing a sufficiently fast comparator is a challenge. In low-voltage DC-DC converters, the voltage signal at the inputs of the comparator can be very small (e.g., in the tens of millivolts). As such, even small offsets in the comparator and delays can lead to large residual inductor currents.

Since the current in an inductor (e.g., a 2.5 nH) can undergo large negative excursions in a very short period of time, the conversion efficiency is governed strongly by the accuracy and speed of the ZCD. While the ZCD comparator offset and delay are desired to be small, its overall power consumption needs to be minimized as well in order to achieve high conversion efficiency at light loads (e.g., less than 10 mA).

The delay of conventional comparators causes significant negative inductor current which leads to significant power loss. This challenge becomes more severe at higher switching frequencies (e.g., 100 MHz or greater). In modern digital CMOS process technology nodes, comparator offset can also significantly contribute to power loss since device mismatch is much more severe in modern deep-submicron CMOS process technology nodes. While some designs intentionally introduce offset in the design of the comparator to compensate for delay, introducing this one-time intentional offset has become a challenge in modern CMOS technology nodes as this offset cannot be accurately controlled across process, voltage, and temperature variations. Additionally the random process mismatch can be larger than the offset required to compensate for delay which eliminates the benefit of this method.

Some embodiments use a self-tuning mechanism to compensate for offsets and delays. In some embodiments, a controlled negative offset is added to the ZCD comparator to compensate for the comparator offset and loop delays. In some embodiments, a circuitry is used to detect residual current after the ZCD comparator has triggered. This detected information is then used to either increase or reduce comparator offset by incrementing or decrementing a register value. As such, non-idealities (e.g., comparator delay, loop delays, random offset, etc.) in the ZCD process are mitigated allowing for fast and accurate operation of DC-DC converters. Further, the design challenges for an analog comparator design are significantly relaxed without compromising system efficiency. Other technical effects will be evident from the various figures and embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Here, the term "backend" generally refers to a section of a die which is opposite of a "frontend" and where an IC (integrated circuit) package couples to IC die bumps. For example, high level metal layers (e.g., metal layer 6 and above in a ten-metal stack die) and corresponding vias that are closer to a die package are considered part of the backend of the die. Conversely, the term "frontend" generally refers to a section of the die that includes the active region (e.g., where transistors are fabricated) and low-level metal layers and corresponding vias that are closer to the active region (e.g., metal layer 5 and below in the ten-metal stack die example).

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nano tubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, etc., may be used without departing from the scope of the disclosure.

It is pointed out that those elements of various figures having the same reference numbers (or names) as the elements of any other figure can operate or function in any manner similar to that described, but are not limited to such.

While the various embodiments here are discussed with reference to a buck DC-DC converter, the embodiments are not limited to such. For example, the embodiments can be used for boost converters, low drop-out regulators, and other types of regulators.

FIG. 1 illustrates an apparatus 100 of a DC-DC converter with zero-current detection (ZCD) and associated self-tuning logic to mitigate non-idealities related to (ZCD), according to some embodiments of the disclosure. In some embodiments, apparatus 100 comprises input power supply rail Vin, output power supply rail Vout, high-side switch 101, low-side switch 102, ZCD comparator 103, self-tuning logic 104, residual current detection circuit 105, load 106, inductor L, load capacitance $C_L$, voltage divider having resistive devices $R_1$ and $R_2$ and capacitive device $C_1$, comparator 108, pulse train finite machine (PFM) logic 107 (or pulse code modulation logic), digital Ton logic 109, tunable current source Is, tunable capacitor C2. The resistive devices can be $R_1$ and $R_2$ can be implemented using passive resistors or active devices such as transistors operating in linear region. The passive resistors can be in the backend of a die while the transistors are on the frontend of the die. The capacitive devices here can be implemented using passive capacitors (e.g., metal capacitors) or active devices such as transistors operating as capacitors. In some embodiments, the capacitive devices are hybrid devices in that they comprise metal capacitors and transistor based capacitors. The metal capacitors can be in the backend of a die while the transistors are on the frontend of the die.

The high-side and low-side switches 101 and 102 are driven by a pulse modulated train of pulses PDrv and NDrv are generated by PFM Logic 107. PFM logic 107 may include a delay line, level-shifters, register, and combinational logic. In some embodiments, the high-side and low-side switches 101 and 102 also include biased transistors coupled in series with the switching transistors of the high-side and low-side switches 101 and 102, respectively. These bias transistors are biased by, for example, Vin/2, Vcc, or Vcc/2. The node Vx coupling the high-side and low-side switches 101 and 102 is coupled to inductor L, which is coupled to load capacitor CL, output supply rail Vout, a voltage divider, and load 106. The output supply rail Vout provides the regulated output supply Vout to load 106 (e.g., processor core, cache, I/O circuit, or any integrated on-chip of off-chip circuitry).

The output of the voltage divider Vo,div is compared by comparator 108 against a reference voltage Vref. The reference voltage Vref may be converted from a programmable digital code by a digital-to-analog converter (DAC). The output of comparator 108 is an Up/Dn indicator which increases or decreases the pulse widths of PDrv and/or NDrv and/or the switching frequencies of PDrv and/or NDrv so as to regulate Vout till Vo,div is substantially same as Vref.

In various embodiments, for ZCD, ZCD comparator 103 is provided that detects the zero current by comparing the voltages V1 and V2 across the low-side switch 102. The output of comparator 103 is Cmp_out which is used to turn on/off the low-side switch 102 when residual inductor current is detected. The ZCD comparator 103 comprises circuitry for power gating, auto-zeroing and digital self-trimming to reduce power consumption while maintaining high accuracy and speed.

An additional challenge for high frequency DCM operation stems from the resonance effects of the distributed output power delivery network (PDN) and on-package ceramic capacitors. This can cause undesirable retriggering of PFM pulses for PDrv, and NDrv, resulting in significantly higher output voltage ripple on Vx node under light load conditions. To suppress retriggering, some embodiments use a programmable forced off-time (generated by PFM Logic 107) that prevents a new pulse from being triggered for a certain time period after the previous pulse has ended. In one example, approximately 1 ns off-time is sufficient to prevent double pulses as shown by plots 1000 and 1020 of FIGS. 10A-B, respectively.

Referring back to FIG. 1, constant ON-time DCM operation causes large variations in inductor peak current across a wide output voltage range (e.g., range of 0.7 to 1.2V), thus degrading conversion efficiency at low output voltages when the inductor peak current far exceeds the nominal target value. For example, an ON-time of 7.5 ns limits the inductor peak current to 1.2 A at the maximum 500 mA output load at 1.2V. At 0.7V output voltage, the same ON-time causes the inductor peak current to increase to 2.7 A, thus impacting efficiency. Some embodiments use a digitally controlled ON-time $T_{on}$ generator 109 that utilizes the digital input/output voltage commands available from the SoC power management unit to compute the correct ON-time for the specific operating load range and inductor peak current target. These digital input/output voltage commands include Vout_code (e.g., digital code indicating the output voltage Vout), Vin_code (e.g., digital code indicating input voltage Vin), peak current code Ipeak_code (e.g., digital cod indicating the peak current on node Vx).

In addition to the use of an auto-zero comparator, a sensor is added which can detect residual current in the inductor based on over- or undershoot on the switching node Vx after the low-side switch 102 is turned off. This information is then used to increment or decrement a register value. This register controls the negative offset of the comparator through a DAC which pre-biases a capacitor which subsequently connects to the AC-coupling capacitors. Through charge-sharing, the voltage on the AC-coupling capacitors is altered thereby effectively introducing an offset. This offset is now a function of the pre-bias voltage which can be controlled through the DAC.

Figure 2:
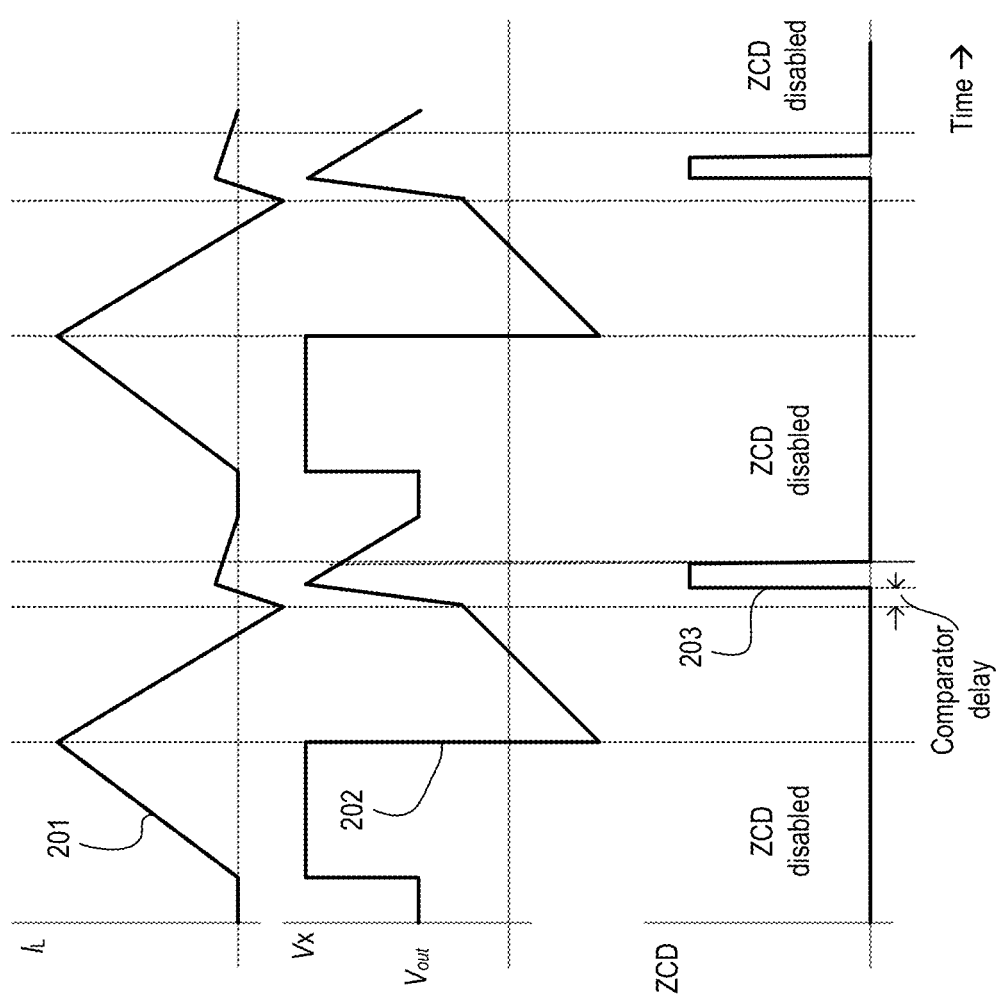
FIG. 2 illustrates a set of plots showing DC-DC converter output and ZCD detection operation, in accordance with some embodiments.

FIG. 2 illustrates a set of plots 200 showing the DC-DC converter output and ZCD detection operation, in accordance with some embodiments. Here, waveform 201 illustrates the inductor current $I_L$, waveform 202 illustrates the switching output voltage Vx, and waveform 203 illustrates the ZCD mechanism. When inductor current falls below zero, the ZCD mechanism is supposed to start. In the absence of the self-tuning mechanism, the comparator delay of the ZCD comparator causes a delay in turning on the ZCD circuit loop resulting in power loss. In various embodiments, the comparator delay is reduced or eliminated by the self-tuning mechanism allowing the ZCD comparator to turn on when inductor current just falls below zero. As such, power loss from the negative inductor current is mitigated. The ZCD mechanism is disabled once the inductor current is positive.

Figure 3:
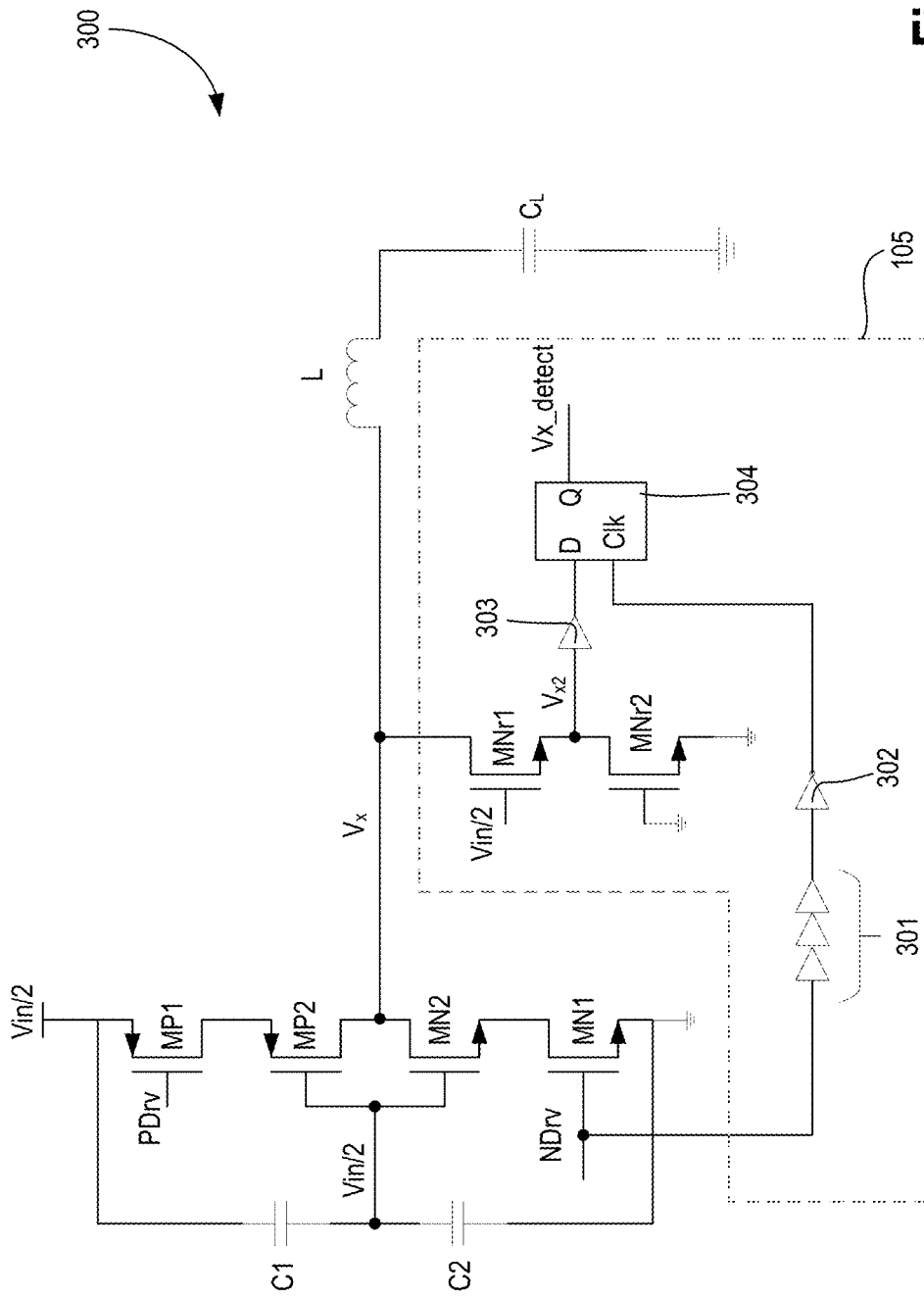
FIG. 3 illustrates an apparatus comprising residual current detection circuit for ZCD detection, in accordance with some embodiments.

FIG. 3 illustrates an apparatus 300 comprising residual current detection circuit for ZCD detection, in accordance with some embodiments. Apparatus 300 comprises p-type transistors MP1 and MP2 of the high-side switch 101, n-type transistors MN1 and MN2 of the low-side switch 102, capacitors C1 and C2, and residual current detection circuit 105. In some embodiments, residual current detection circuit 105 comprises n-type transistors MNr1 and MNr2 coupled together in series, delay buffers 301, inverter 302, buffer 303, and sequential logic (e.g., flip-flop) 304 coupled together as shown.

In order to allow accurate tuning of the comparator offset, the residual current in the inductor L is detected reliably by residual current detection circuit 105. The residual current detection circuit 105 observes the switching node (Vx) voltage at the correct point in time (e.g., when Vx rises above zero). In some embodiments, transistor MNr1 is a protection device which limits the voltage to the digital supply (e.g., Vcc or Vin/2). The protection device is used to protect other circuitries of residual current detection circuit 105 when the converter input voltage Vin is higher than the digital Vcc. The output $V_{x2}$ is a digital signal which can be fed to a sequential unit 304. In order to sample the signal at the right time, a delayed version of the low side switch gate signal NDrv is used. For example, NDrv is delayed by buffers 301 and inverted by inverter 302 to sample the buffered output Vx2. These delay buffers 301 are tuned in corner simulations to ensure reliable detection across process, voltage, temperature (PVT). The sampled output is Vx_detect is received by the self-tuning logic 104. In some embodiments, self-tuning logic 104 applies the Vx_detect output to increment or decrement the offset code. For example, an up/down counter of the self-tuning logic 104 is incremented or decremented to update the offset code, which is an output value of the counter. The operation of residual current detection circuit 105 is described with reference to FIGS. 6-7.

Figure 4:
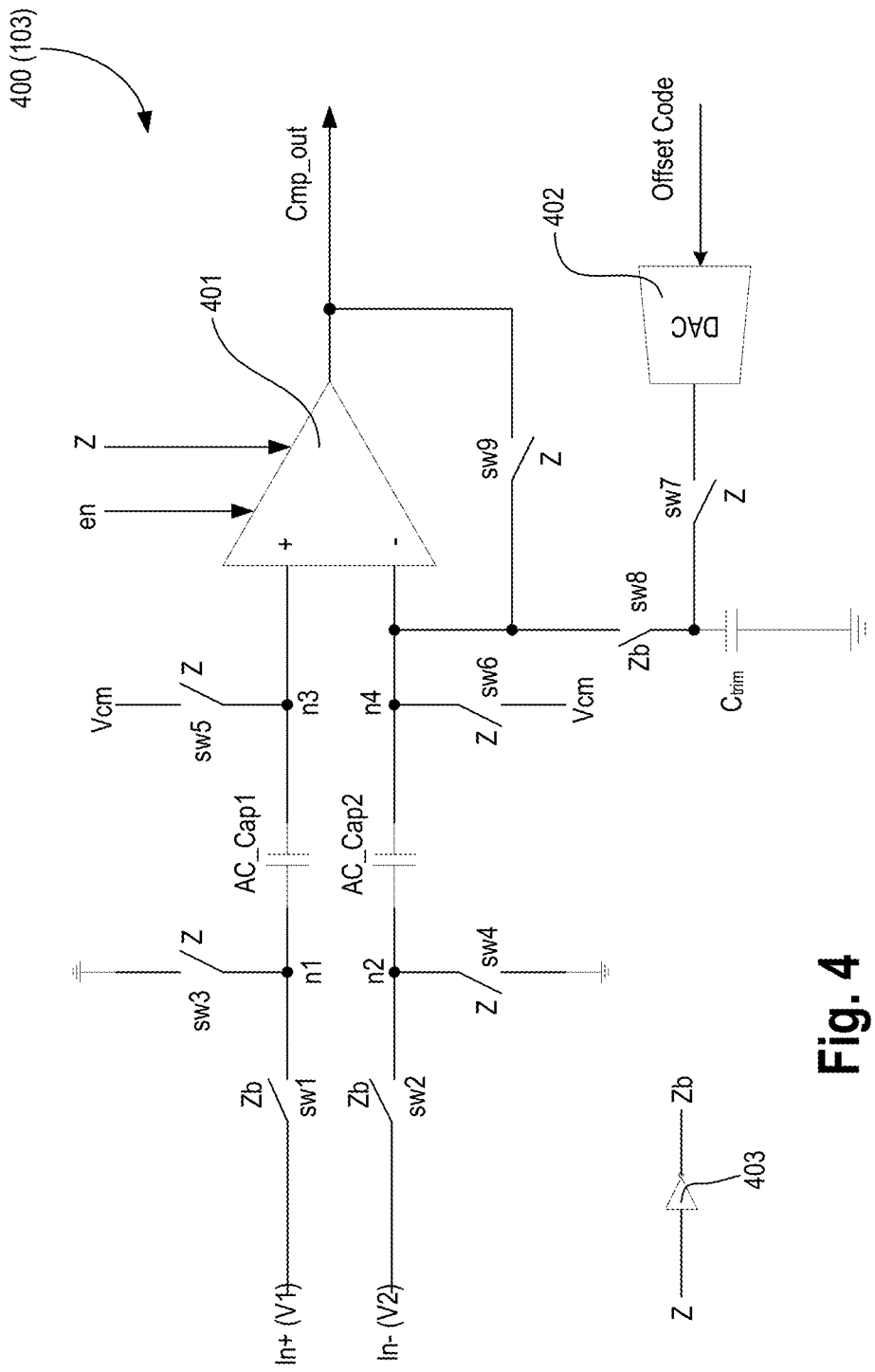
FIG. 4 illustrates an apparatus comprising a comparator with offset calibration for ZCD detection, in accordance with some embodiments.

FIG. 4 illustrates apparatus 400 comprising a comparator with offset calibration for ZCD detection, in accordance with some embodiments. In some embodiments, apparatus 400 comprises AC coupling capacitors AC_Cap_1, AC_cap2, switches sw1, sw2, sw3, sw4, sw5, sw6, sw7, sw8, and sw9, power gated comparator 401, digital to analog converter (DAC) 402, and capacitive device $C_{trim}$. The AC coupling capacitors are coupled between nodes n1 and n3, and n3 and n4, respectively. Common mode voltage Vcm is provided to nodes n3 and n4 via switches sw4 and sw6, while ground or 0V is provided to nodes n1 and n2 via switches sw3 and sw4. The inputs to comparator 103 are In+ (e.g., V1) and In− (e.g., V2), while the output is Comp_out.

Here, 'Z' and "en" signals are derived off the high-side switch signal PDrv and low-side switch signal NDrv. A current pulse starts when the high-side switch 101 turns on (e.g., Z and en go high), after a certain time expires, the high-side switch 101 turns off and the low-side switch 102 turns on (e.g., Z goes low, en stays high). After the ZCD comparator 103 triggers an output (e.g., Cmp_out goes low) the low-side switch 102 turns off (e.g., en goes low). Both high-side switch 101 and low-side switch remain off until a new inductor current pulse is started, in accordance with some embodiments.

Switches sw1, sw2, and sw8 is controllable by Zb (inverse of Z), while switches sw3, sw4, sw5, sw6, sw7, and sw9 are controllable by zero signal Z. Zb is generated by inverter 403. When Z is high, which causes switches sw1, sw2, and sw8 to close, and switches sw3, sw4, sw5, sw6, sw7, and sw9 to open. When Zb (inverse of Z) is high which causes sw3, sw4, sw5, sw6, sw7, and sw9 to close, and sw1, sw2, and sw8 to open.

In some embodiments, ZCD comparator 103 is power-gated between DCM pulses to save bias currents. This power gating can be performed by an enable signal (en) generated by self-tuning logic 104. During this idle period (or gating period), the input bias branch is kept ON to enable fast transition to active state, in accordance with some embodiments. This input bias branch provides common mode voltage Vcm to nodes n3 and n4. Once an inductor current pulse is initiated, apparatus 400 enters an auto-zero mode while the high-side power switch 101 is turned on. In the auto-zero mode, an internal compensation network for comparator 401 is activated to allow stable operation in feedback and sample the offset voltage onto the offset-storage capacitor $C_{trim}$ at the input. After high-side switch 101 turns off, the compensation network and feedback connection are disabled, and the comparator enters the compare mode.

Figure 9:
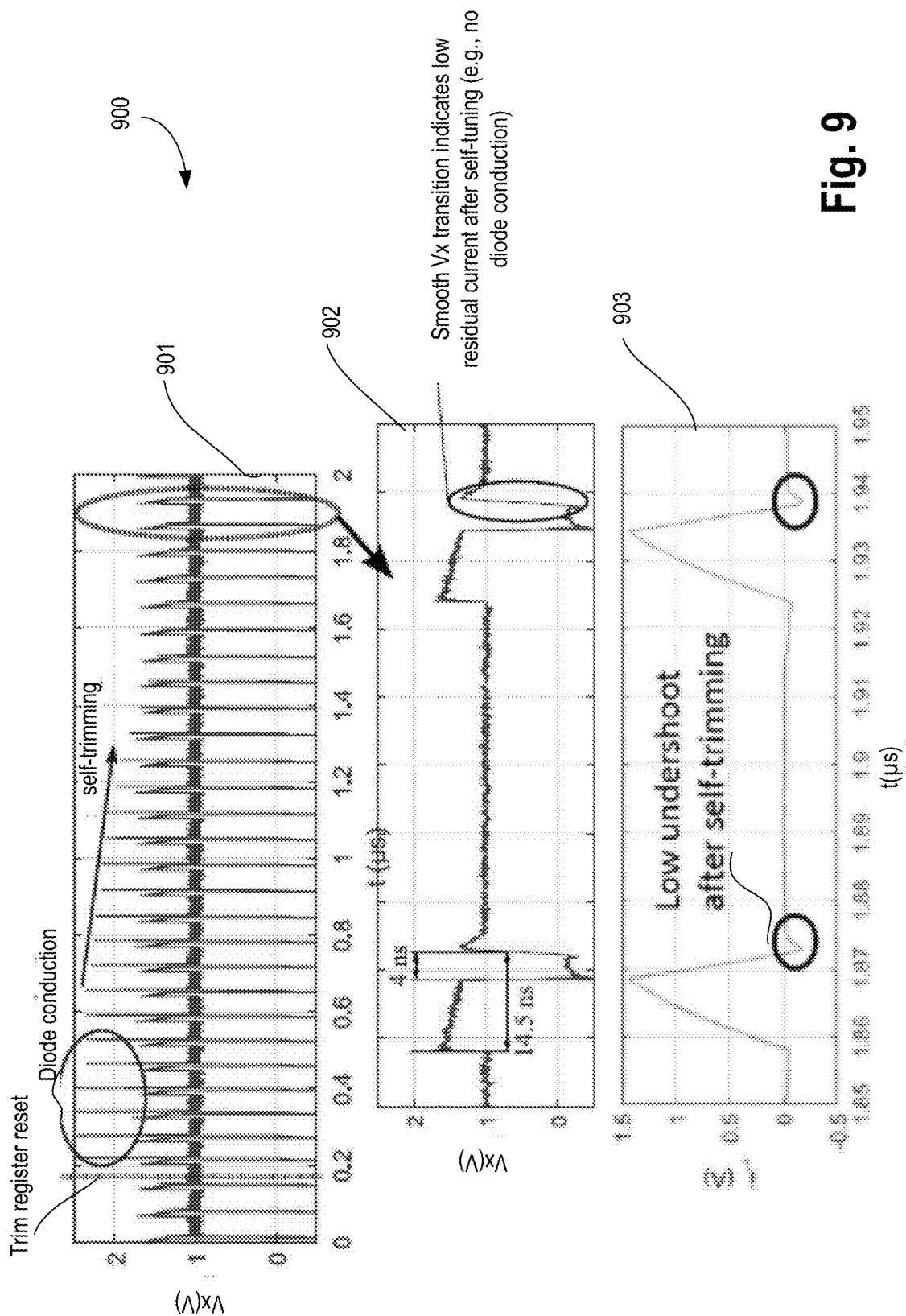
FIG. 9 illustrates a set of plots showing self-tuning operation resulting in low current undershoot, in accordance with some embodiments.

In some embodiments, capacitor, $C_{trim}$, is pre-charged through a capacitive DAC (e.g., a 5-bit DAC) to a digitally controlled voltage. The DAC 402 receives the offset code (e.g., a multibit signal) from the self-tuning logic 104. This offset code is based on the output Cmp_out of comparator 401. For example, the offset code is an output of an up/down counter of self-tuning logic 104 which uses the Vx_detect signal to increment or decrement its up/down counter. During the high-to-low side transition of Vx, $C_{trim}$ is connected to the offset-storage capacitor AC_Cap2 to introduce a small controllable offset. This offset is controlled through an additional loop which uses the residual current detector 105 to adjust the comparator trip-point, thereby correcting for any remaining offset and circuit delays. Measurements, as illustrated by FIG. 9, demonstrate convergence of the loop to a very low residual current after the offset register is reset.

Figure 5:
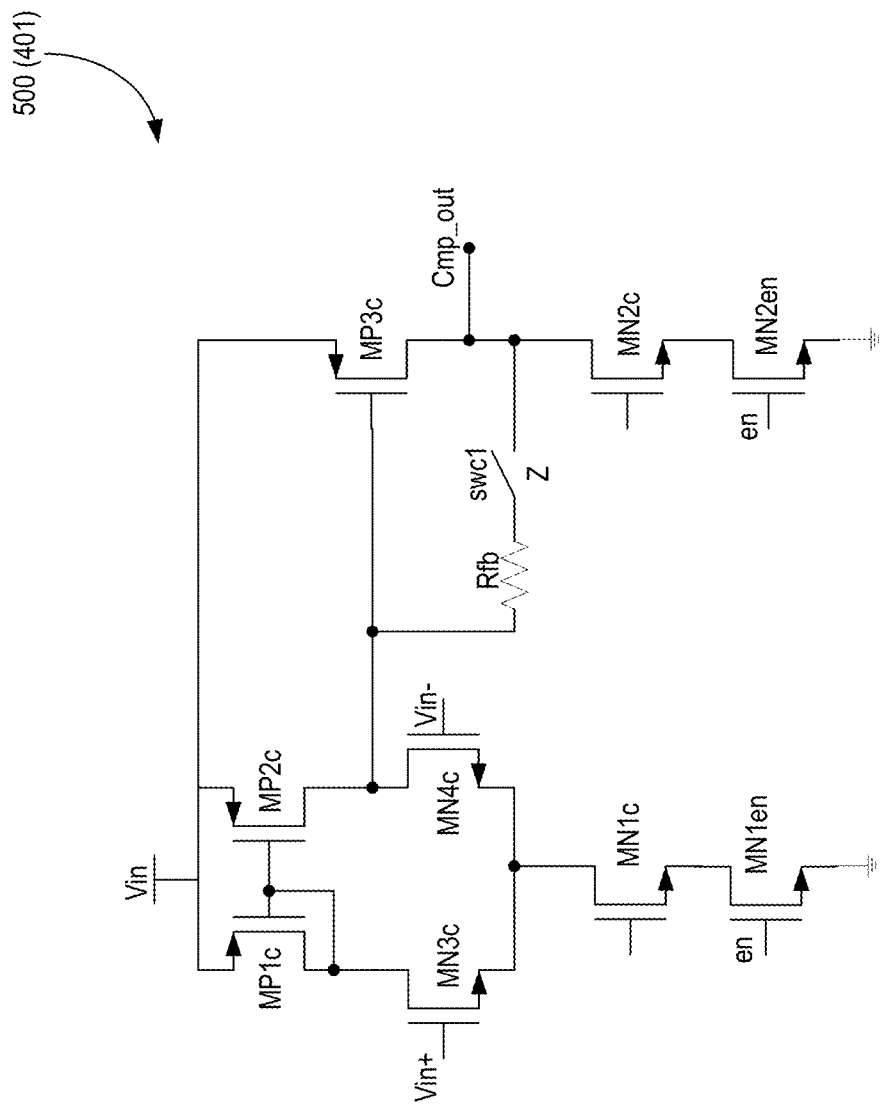
FIG. 5 illustrates an apparatus of the comparator of FIG. 4, in accordance with some embodiments.

FIG. 5 illustrates an apparatus 500 (e.g., 401) of the comparator of FIG. 4, in accordance with some embodiments. Apparatus 500 comprises p-type transistors MP1c, MP2c, and MP3c; n-type transistors MN1en, MN1c, MN2en, MN2c, MN3c, and MN4c; feedback compensation resistor Rfb, and switch swc1 controllable by Z, and coupled together as shown. During power gating or idle period, enable en is low which cuts off the current path through comparator 500. While the embodiments show apparatus 500 as comparator 401, other power gating capable low offset comparators can also be used.

Figure 6:
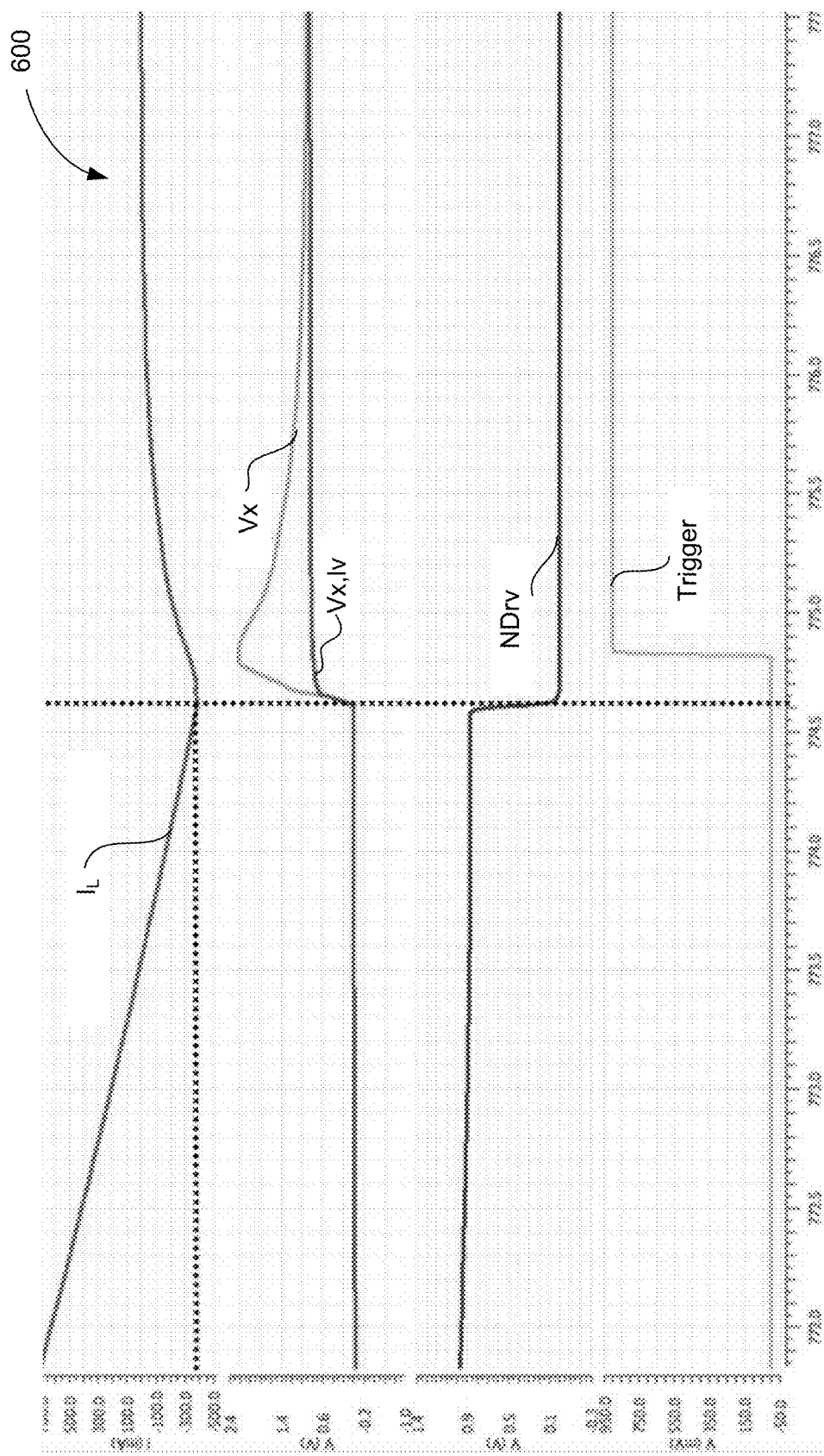
FIG. 6 illustrates a set of plots showing waveforms for residual current detection with negative residual current, in accordance with some embodiments.
Figure 7:
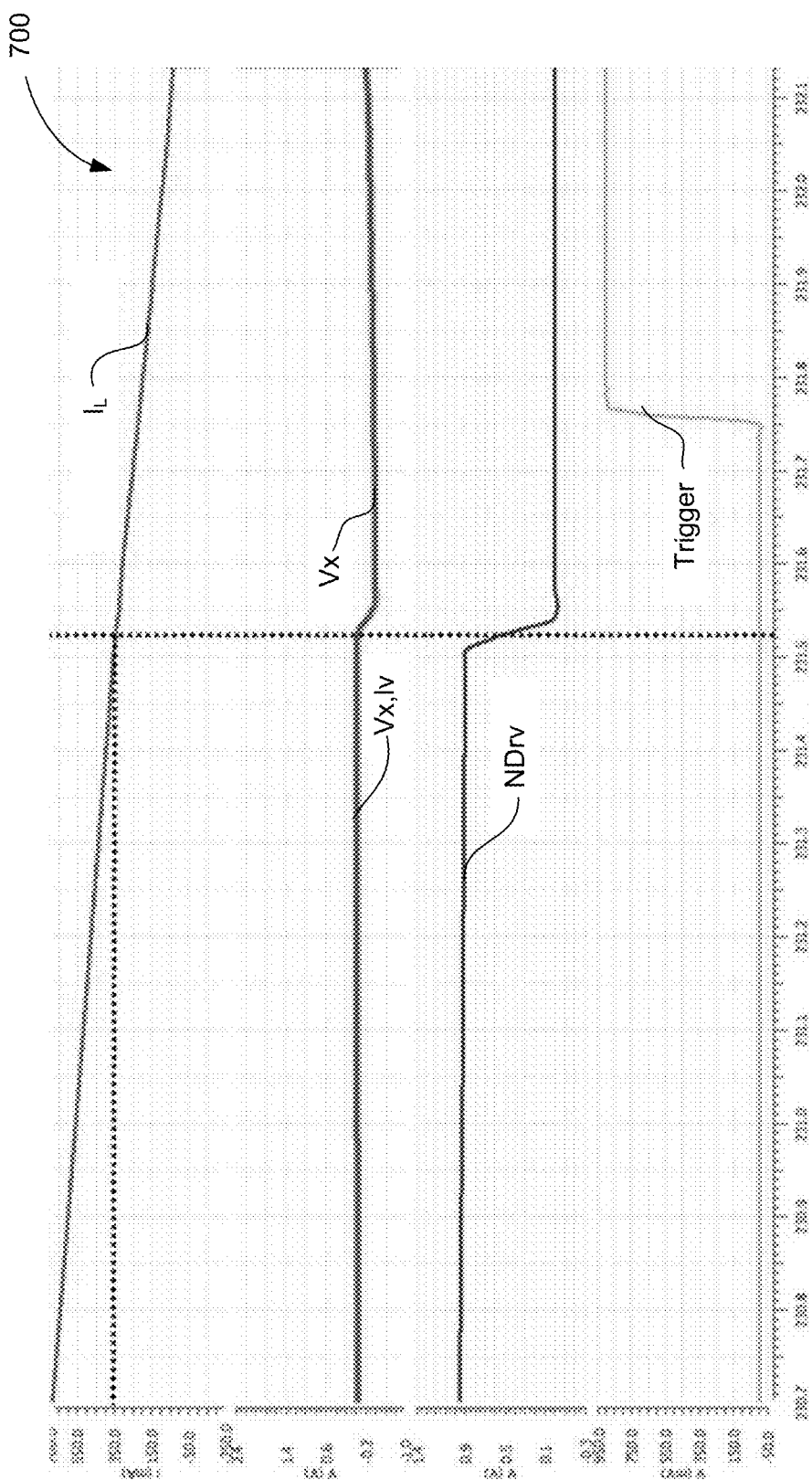
FIG. 7 illustrates a set of plots showing waveforms for residual current detection with positive residual current, in accordance with some embodiments.

FIG. 6 illustrates a set of plots 600 showing waveforms for residual current detection with negative residual current, in accordance with some embodiments. FIG. 7 illustrates a set of plots 700 showing waveforms for residual current detection with positive residual current, in accordance with some embodiments. As shown in FIGS. 6-7, after transistor MN1 of low side switch 101 is turned off (e.g., NDrv goes low) the switching node voltage (Vx) either goes high or low depending on whether there is negative or positive residual current in the inductor L. Since even small residual currents lead to a large voltage swing on Vx, this signal can be easily detected. A further advantage of using this mechanism for detection is, that it is a direct indication of the residual current and is not subject to further measurement errors like other current-sensing methods. While Vx_detect is a one bit signal (indicating positive or negative current), in some embodiments, multi-bit Vx_detect signal can be used to determine how much negative or positive the inductor current is.

Figure 8:
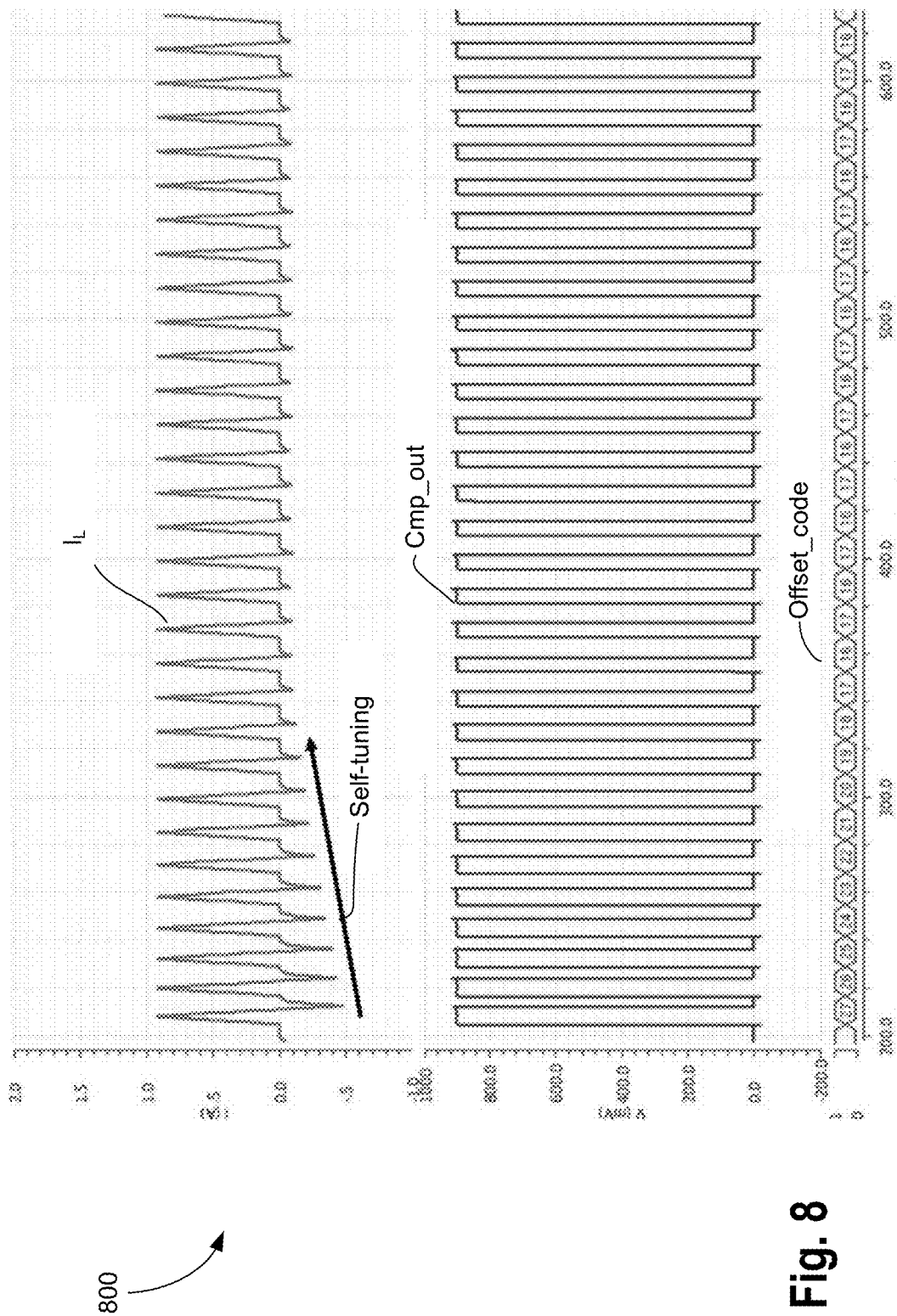
FIG. 8 illustrates a set of plots showing waveforms of ZCD with self-tuning loop, in accordance with some embodiments.

FIG. 8 illustrates a set of plots 800 showing waveforms of ZCD with self-tuning loop, in accordance with some embodiments. FIG. 8 shows simulation results of a full DC-DC converter in operation with the ZCD self-tuning loop of some embodiments enabled. As can be seen from the inductor current waveform, initially the comparator delay causes significant undershoot in the inductor current $I_L$ which may be undesirable. In the subsequent cycle, the self-tuning loop slowly tunes the comparator offset (Offset-_code) to achieve close to zero residual inductor current. Due to the residual current detection, all offsets and delays in the loop can be compensated and a very small steady state error can be achieved, in accordance with various embodiments.

FIG. 9 illustrates a set of plots 900 showing self-tuning operation resulting in low current undershoot, in accordance with some embodiments. Plot 901 shows the ripple in Vx as a function of time. A zoomed version of the ripple is shown in plot 902 after self-trimming (e.g., offset compensation). As seen in the zoomed version, smooth Vx transition indicates low residual current after self-tuning (e.g., no diode conduction is seen in this example). Plot 903 illustrates low undershoot after self-trimming using the apparatus of various embodiments.

Figure 10A:
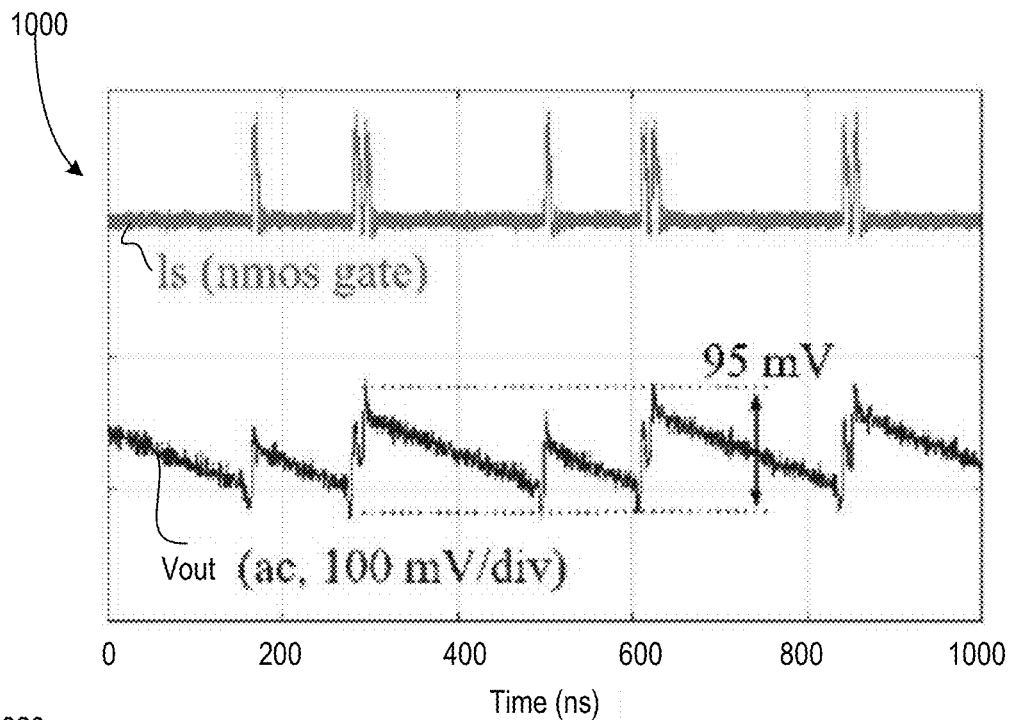
Figure 10B:
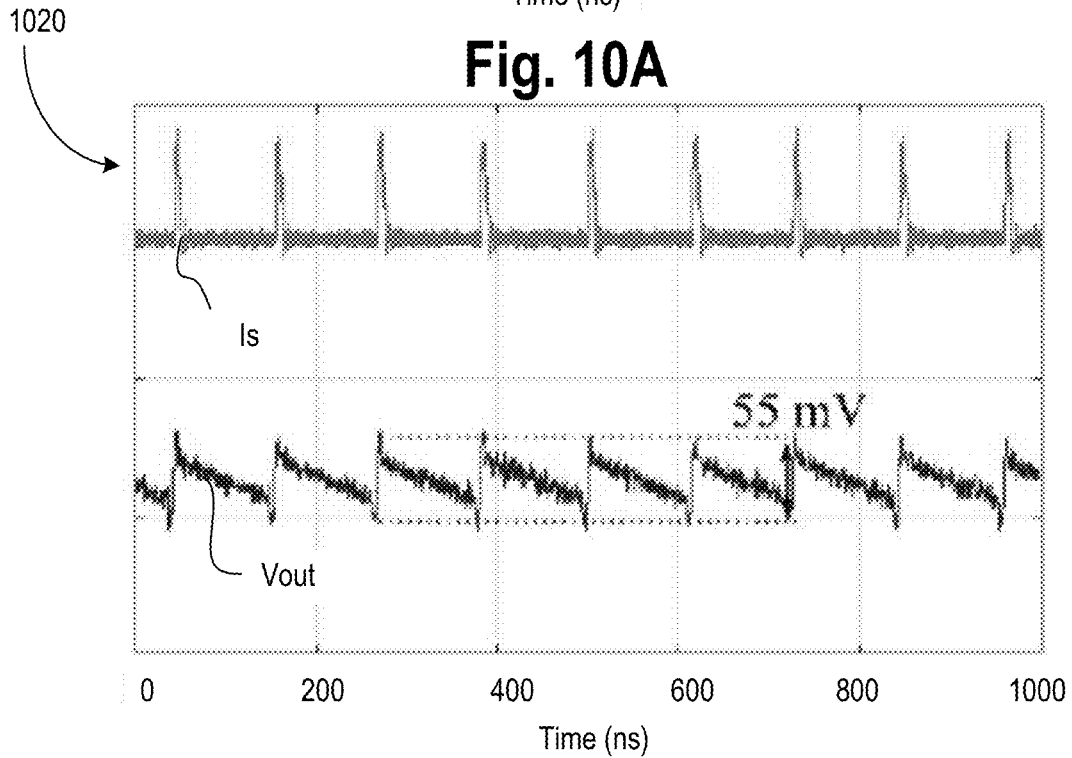

FIGS. 10A-B illustrate plots 1000 and 1020, respectively, showing measurement data of output voltage ripple in light-load PFM operation, where plot 1000 of FIG. 10A shows double triggering due to power delivery network (PDN) resonance effects, while FIG. 10B 1020 shows that the programmable off-time is effective in preventing retriggering, in accordance with some embodiments.

Figure 11A:
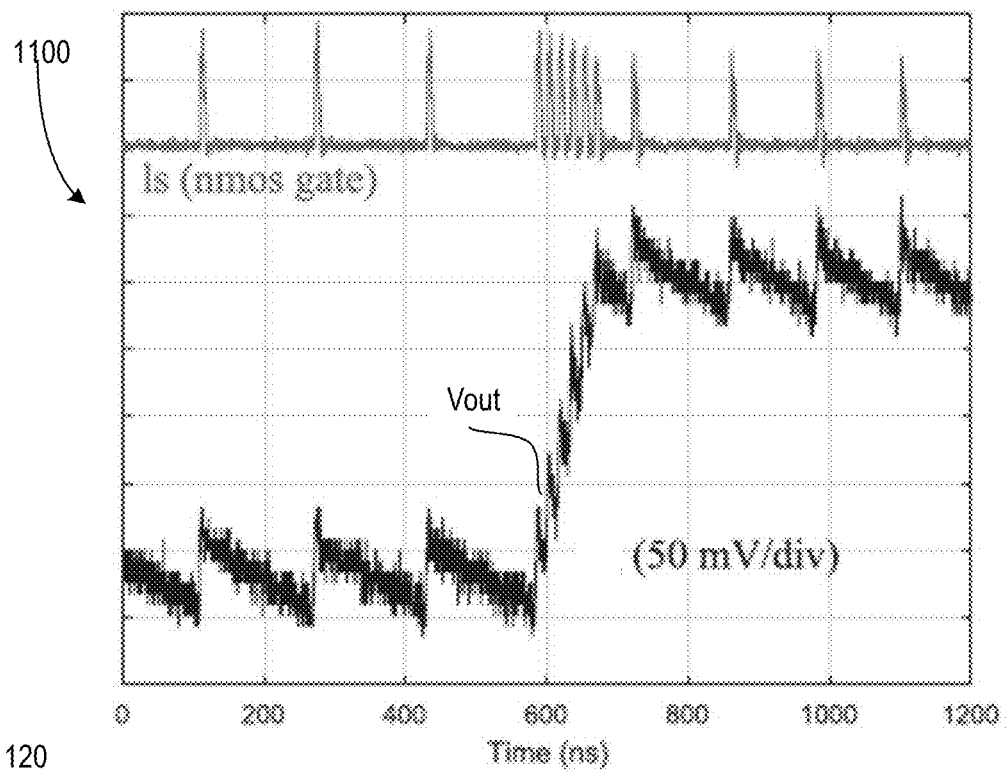
FIGS. 11A-B illustrate plots showing transient measurement waveforms for reference steps with automatic on-time adjustment, and without the automatic on-time adjustment, respectively, in accordance with some embodiments.
Figure 11B:
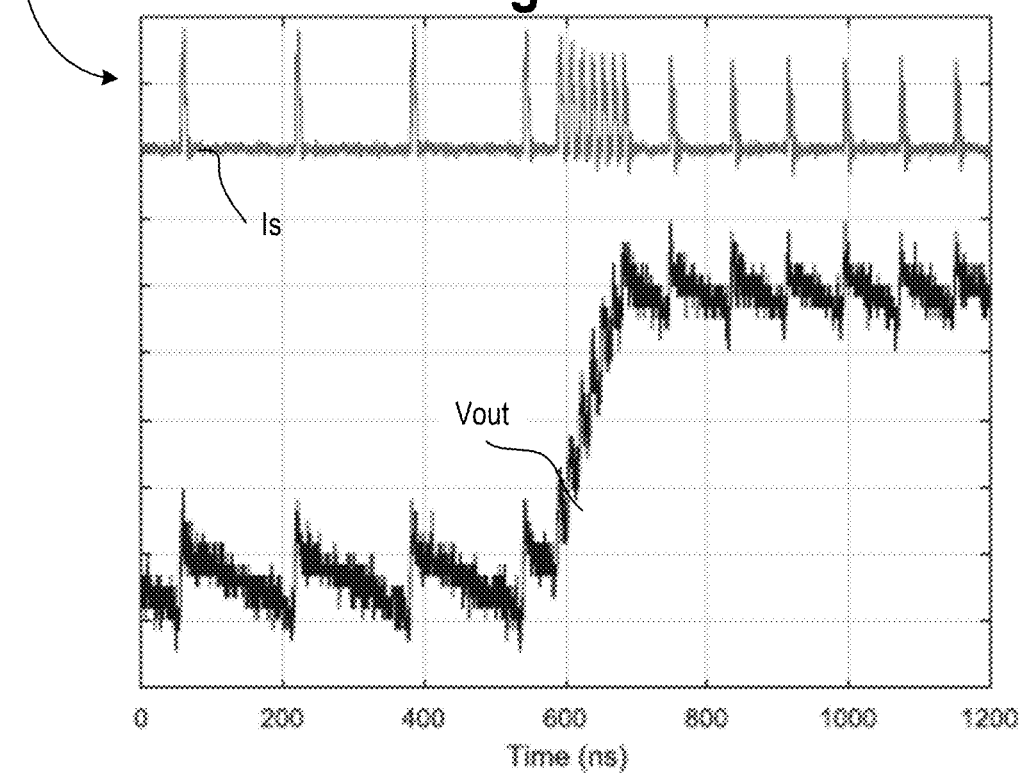

FIGS. 11A-B illustrate plots 1100 and 1120 showing transient measurement waveforms for reference steps with automatic on-time adjustment, and without the automatic on-time adjustment, respectively, in accordance with some embodiments. Measurements demonstrate that the inductor peak current is held approximately constant after an output voltage change by a constant pulse frequency before and after the voltage transition, as opposed to a constant ON-time scheme.

Figure 12A:
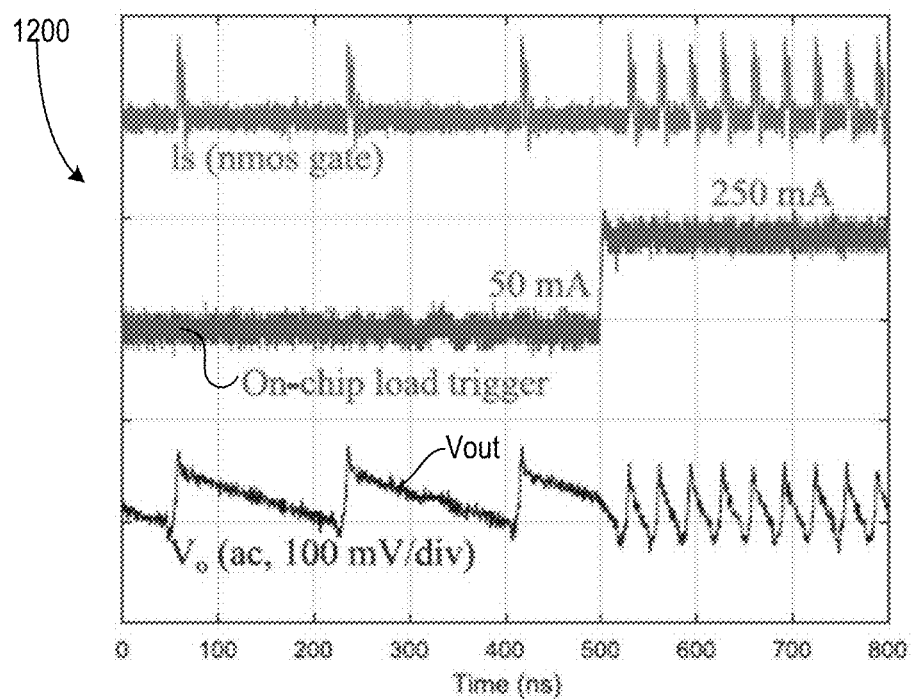
FIGS. 12A-B illustrate plots showing output current loading and unloading transient waveforms, respectively, with high-speed on-ship load.
Figure 12B:
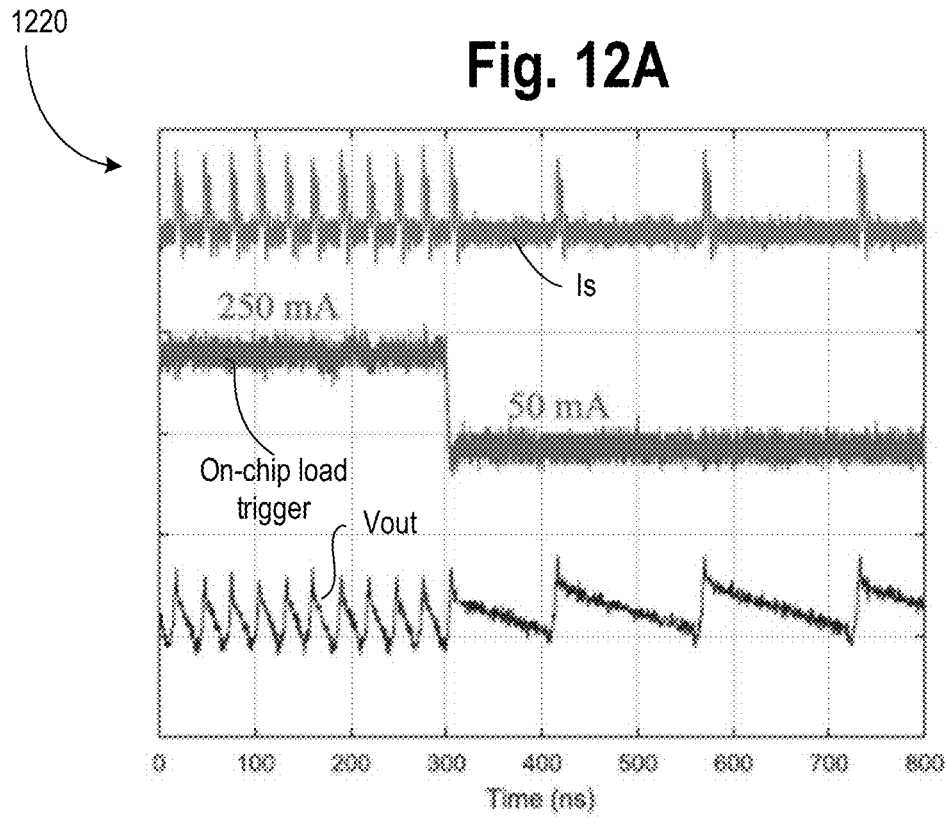
Figure 13D:
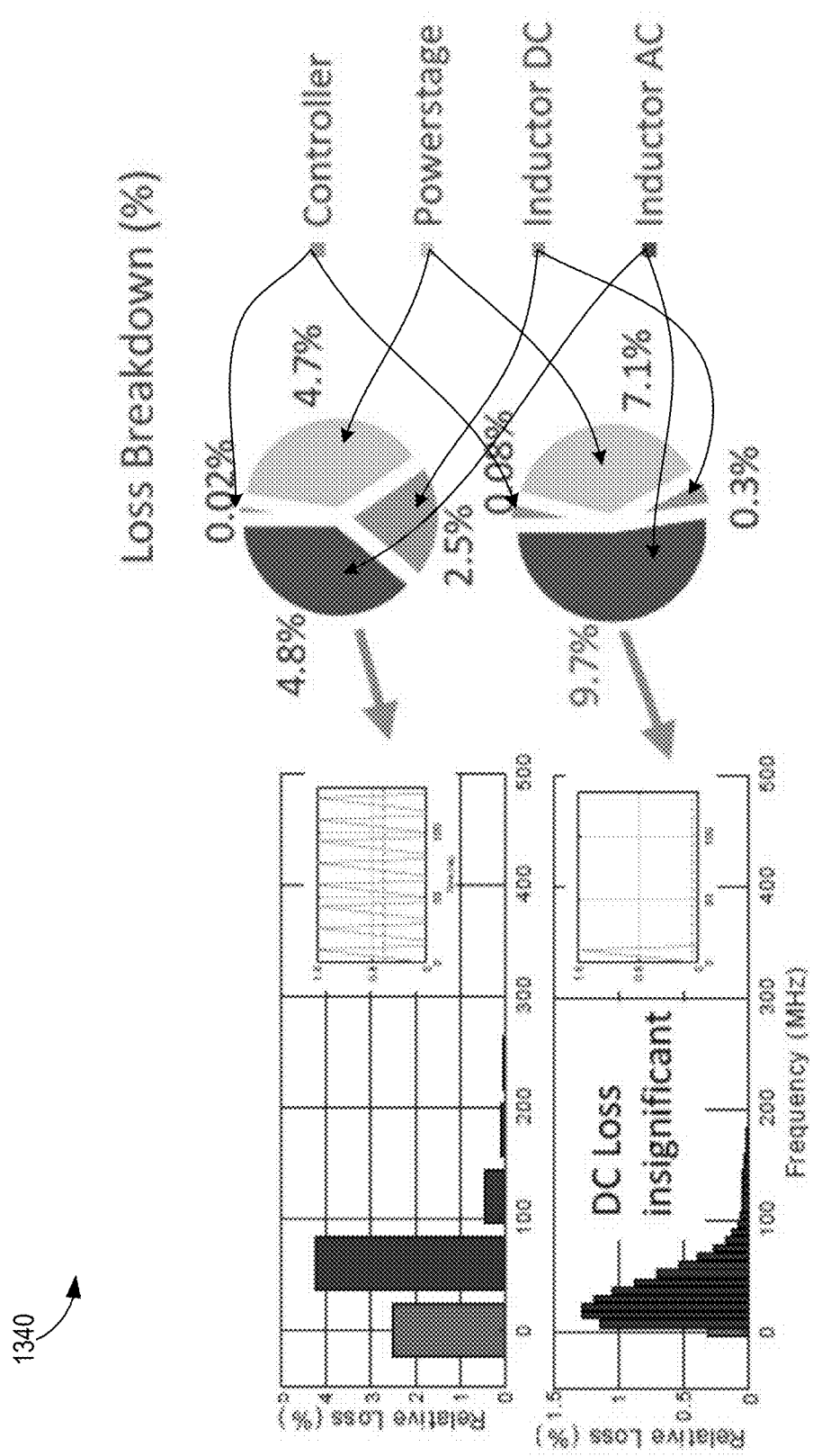

FIGS. 12A-B illustrate plots 1200 and 1220 showing output current loading and unloading transient waveforms, respectively, with high-speed on-ship load (e.g., 50 ps rise time). The conversion efficiency measurements across a wide range of output voltages demonstrate the effectiveness of the digitally-controlled variable ON-time scheme of various embodiments, compared to a constant-ON time implementation. Transient performance of the FIVR control loop for both reference voltage steps and load current transients are measured. Fast FIVR response, enabled by the high-speed comparator, to a 200 mA loading and unloading transient is demonstrated using an on-chip load with sub-ns turn-on time.

FIGS. 13A-D illustrate plots 1300, 1320, 1330, and 1340 showing measured efficiency data vs. load current for different output voltage, efficiency vs. output voltage for constant and variable (auto adjusted) on time, and inductor power loss spectrum, respectively. FIGS. 13A-D shows the FIVR conversion efficiency measurements across a wide range of output voltages and load currents, as well as the major loss components. In this example, at 500 mA load current, efficiencies of 88%, 82% and 75% are achieved for output voltages of 1.2V, 1V and 0.8V, respectively. The efficiency is fairly constant across 5 mA-500 mA loads since the PFM controller power overhead of 33 uA is low, but it drops off significantly below 5 mA. As illustrated by the measured spectral components of the inductor current and the inductor AC resistance characteristics, this efficiency degradation is largely caused by the AC-resistance loss in the low quality-factor air-core inductor embedded in the coreless ultrathin package becoming the dominant loss component under light load conditions. For higher loads, a larger portion of the inductor current spectrum is at DC, thus causing inductor losses to be lower. At light load, the DC component becomes small and the AC-resistance losses are dominant.

Figure 14:
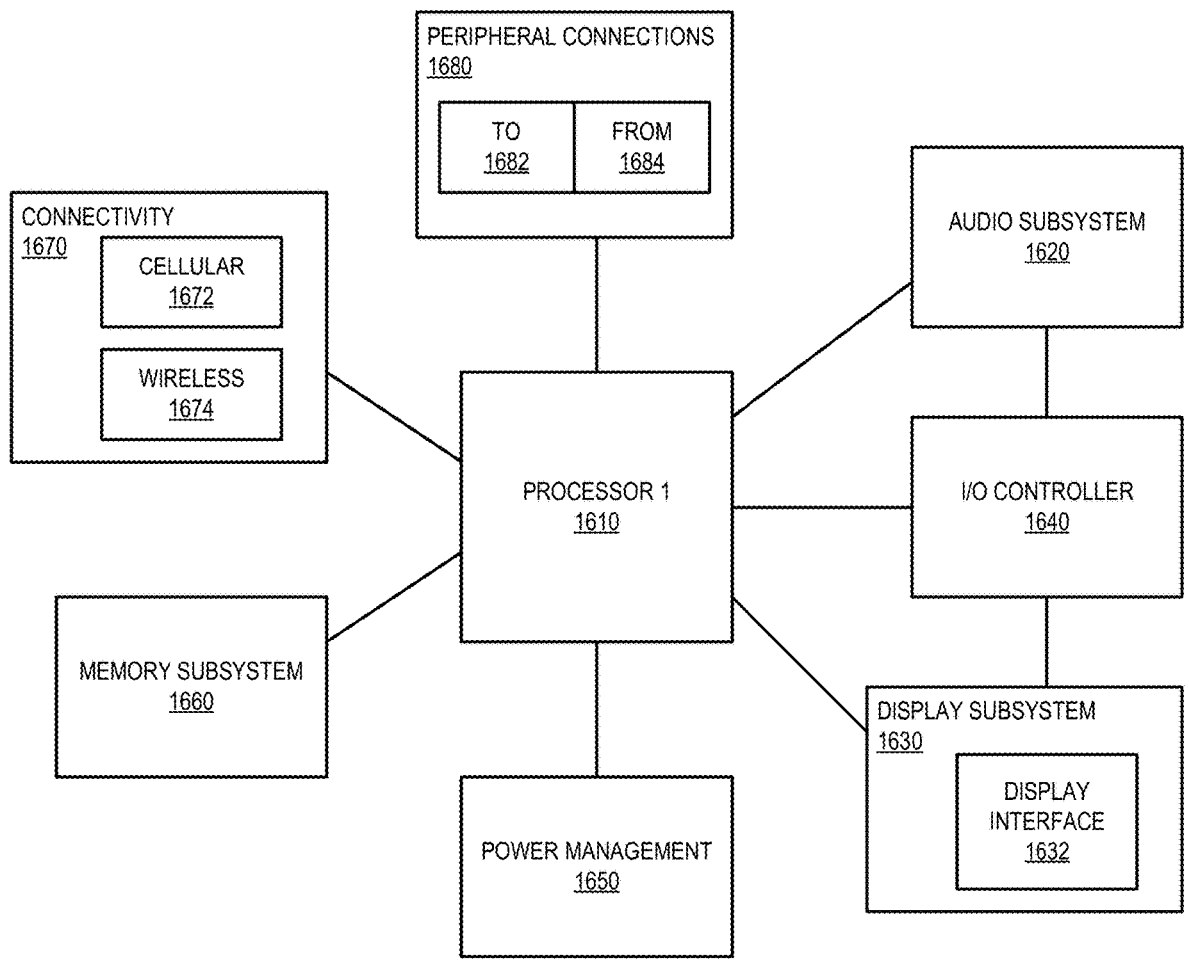
FIG. 14 illustrates a smart device or a computer system or a System-on-Chip (SoC) with DC-DC converter having ZCD and apparatus to mitigate non-idealities related to ZCD, according to some embodiments.

FIG. 14 illustrates a smart device or a computer system or a System-on-Chip (SoC) with DC-DC converter having ZCD and apparatus to mitigate non-idealities related to ZCD, according to some embodiments. FIG. 14 illustrates a smart device or a computer system or a System-on-Chip (SoC) with DC-DC converter having ZCD and apparatus to mitigate non-idealities related to ZCD, according to some embodiments. FIG. 14 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes processor 1610 with DC-DC converter having ZCD and apparatus to mitigate non-idealities related to ZCD, according to some embodiments discussed. Other blocks of the computing device 1600 may also include DC-DC converter having ZCD and apparatus to mitigate non-idealities related to ZCD, according to some embodiments. The various embodiments of the present disclosure may also comprise a network interface within 1670 such as a wireless interface so that a system embodiment may be incorporated into a wireless device, for example, cell phone or personal digital assistant.

In one embodiment, processor 1610 can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. In some embodiments, audio subsystem 1620 includes apparatus and/or machine executable instructions to avoid self-hearing, according to some embodiments. Devices for such functions can be integrated into computing device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In one embodiment, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, computing device 1600 includes power management 1650 that manages battery power usage, charging of the battery, and features related to power saving operation. Memory subsystem 1660 includes memory devices for storing information in computing device 1600.

Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), Display- Port including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

It is claimed:

1. An apparatus comprising: a comparator circuitry having a first input, a second input, and a third input, wherein the comparator circuitry comprises a digital-to-analog converter (DAC) having an input coupled to the third input of the comparator circuitry; a first device coupled to the first and second inputs of the comparator circuitry, wherein an output of the DAC is switchably coupled to a terminal of a capacitor via a switch, wherein the switch is controllable by a first signal derived off a second signal that controls the first device; and a circuitry to generate a digital code which represents a comparator offset adjustment with reference to detection of current through a second device, wherein the digital code is provided to the third input of the comparator circuitry.

2. The apparatus of claim 1, wherein the comparator circuitry comprises:
    first and second AC coupling capacitors coupled to the first and second inputs via first and second controllable switches, respectively; wherein the
    capacitor is coupled to one of the first or second AC coupling capacitors via a third controllable switch.

3. The apparatus of claim 2, wherein the comparator circuitry comprises a fourth input to receive a common mode voltage, and wherein the common mode voltage is coupled to the first and second AC coupling capacitors.

4. The apparatus of claim 1, wherein the comparator circuitry is power gated.

5. The apparatus of claim 1, wherein the first device is part of a low-side switch of a DC-DC converter.

6. The apparatus of claim 1, wherein the second device is an inductor.

7. The apparatus of claim 1, wherein the circuitry comprises:
    a first transistor coupled to the second device;
    a second transistor coupled in series with the first transistor;
    a buffer coupled to the first and second transistors; and
    a flip-flop coupled to the buffer, wherein a clock input of the flip-flop is controllable by a signal received by a low-side switch, wherein the first device is part of the low-side switch, and wherein an output of the flip-flop is to provide the detection of current through the second device.

8. The apparatus of claim 7, wherein the circuitry includes a counter to count up or down a value of the digital code according to the output of the flip-flop.

9. The apparatus of claim 7, wherein a gate terminal of the first transistor is coupled to a power supply node that is to provide half of an input supply voltage.

10. The apparatus of claim 7, wherein a gate terminal of the second transistor is coupled to ground.

11. The apparatus of claim 7, wherein the signal received by the low-side switch is delayed before it is provided as the clock input for the flip-flop.

12. An apparatus comprising:
    a high-side switch coupled to a first power supply rail;
    a low-side switch coupled in series with the high-side switch, wherein the low-side switch is coupled to ground;
    an inductor coupled to the high-side and low-side switches;
    a comparator circuitry having a first input, a second input, and a third input, wherein the first and second inputs are coupled to the low-side switch, wherein a digital code is provided to the third input to adjust an offset of the comparator circuitry according to a current through the inductor, wherein the comparator comprises a digital-to-analog converter (DAC) having an input coupled to the third input of the comparator circuitry, wherein an output of the DAC is switchably coupled to a terminal of a capacitor via a switch, and wherein the switch is controllable by a first signal derived off a second signal that controls the low-side switch;

a current detection circuitry to detect current through the inductor and to provide that detection as an output; and circuitry to receive the output of the current detection circuitry and to adjust the digital code according to the output of the current detection circuitry.

13. The apparatus of claim 12, wherein current detection circuitry comprises:

a first transistor coupled to the inductor;

a second transistor coupled in series with the first transistor;

a buffer coupled to the first and second transistors; and a flip-flop coupled to the buffer, wherein a clock input of the flip-flop is controllable by a signal received by the low-side switch.

14. The apparatus of claim 12, wherein the comparator circuitry comprises:

first and second AC coupling capacitors coupled to the first and second inputs via first and second controllable switches, respectively; wherein the capacitor is coupled to one of the first or second AC coupling capacitors via a third controllable switch.

15. The apparatus of claim 14, wherein the comparator circuitry comprises a fourth input to receive a common mode voltage, and wherein the common mode voltage is coupled to the first and second AC coupling capacitors.

16. The apparatus of claim 12, wherein the comparator circuitry is power gated.

17. A system comprising: a memory; a processor coupled to the memory, wherein the processor includes a DC-DC converter which comprises: a comparator circuitry having a first input, a second input, and a third input, wherein the comparator circuitry comprises a digital-to-analog converter (DAC) having an input coupled to the third input of the comparator circuitry; a first device coupled to the first and second inputs of the comparator circuitry, wherein an output of the DAC is switchably coupled to a terminal of a capacitor via a switch, wherein the switch is controllable by a first signal derived off a second signal that controls the first device; and a circuitry to generate a digital code which represents a comparator offset adjustment with reference to detection of current through a second device, wherein the digital code is provided to the third input of the comparator circuitry; and a wireless interface to allow the processor to communicate with another device.

18. The system of claim 17, wherein the comparator circuitry comprises:

first and second AC coupling capacitors coupled to the first and second inputs via first and second controllable switches, respectively; wherein the capacitor is coupled to one of the first or second AC coupling capacitors via a third controllable switch.

19. The system of claim 18, wherein the circuitry comprises:

a first transistor coupled to the second device;

a second transistor coupled in series with the first transistor;

a buffer coupled to the first and second transistors; and a flip-flop coupled to the buffer, wherein a clock input of the flip-flop is controllable by a signal received by a low-side switch, wherein the first device is part of the low-side switch, and wherein an output of the flip-flop is to provide the detection of current through the second device.

20. The system of claim 19, wherein the circuitry includes a counter to count up or down a value of the digital code according to the output of the flip-flop.

* * * * *